(12) United States Patent
Baumgartner et al.

(10) Patent No.: US 10,840,093 B2
(45) Date of Patent: Nov. 17, 2020

(54) FABRICATION OF SEMICONDUCTOR SUBSTRATES

(71) Applicant: International Business Machines Corporation, Armonk, NY (US)

(72) Inventors: Yannick Baumgartner, Thalwil (CH); Lukas Czornomaz, Zurich (CH); Heinz Schmid, Waede (CH); Philipp Staudinger, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 16/127,669

(22) Filed: Sep. 11, 2018

(65) Prior Publication Data

US 2020/0083042 A1    Mar. 12, 2020

(51) Int. Cl.
*H01L 21/02* (2006.01)
*C30B 25/18* (2006.01)

(52) U.S. Cl.
CPC ........ *H01L 21/02647* (2013.01); *C30B 25/18* (2013.01); *H01L 21/0242* (2013.01); *H01L 21/0262* (2013.01); *H01L 21/02381* (2013.01); *H01L 21/02387* (2013.01); *H01L 21/02433* (2013.01); *H01L 21/02609* (2013.01); *H01L 21/02645* (2013.01)

(58) Field of Classification Search
CPC ...................................................... H01L 21/02
See application file for complete search history.

(56) References Cited

U.S. PATENT DOCUMENTS

| | | |
|---|---|---|
| 8,173,551 B2 | 5/2012 | Bai et al. |
| 8,183,667 B2 | 5/2012 | Park |
| 8,574,968 B2 | 11/2013 | Arena et al. |
| 8,716,049 B2 | 5/2014 | Su et al. |
| 8,859,399 B2 | 10/2014 | Zang et al. |
| 9,748,098 B2 | 8/2017 | Balakrishnan |

*Primary Examiner* — Marvin Payen
(74) *Attorney, Agent, or Firm* — Harrington & Smith (57) ABSTRACT

A method for fabricating a semiconductor substrate comprises providing a crystalline base substrate, forming an insulating layer on the crystalline base substrate and forming a trench in the insulating layer. This exposes a seed surface of the base substrate. The trench has sidewalls and a bottom. The bottom corresponds to the seed surface of the base substrate. The method further comprises growing, at a first growth step, an elongated seed structure in the trench from the seed surface of the substrate and forming a cavity structure above the insulating layer. The cavity structure covers the elongated seed structure and extends laterally to the elongated seed structure. The method comprises a further step of growing, at a second growth step, the semiconductor substrate in the cavity structure from the elongated seed structure. The invention is notably also directed to corresponding semiconductor structures and corresponding semiconductor substrates.

19 Claims, 5 Drawing Sheets

FABRICATION OF SEMICONDUCTOR SUBSTRATES

BACKGROUND

Embodiments of the invention relate generally to the fabrication of semiconductor substrates and more particularly to the fabrication of compound semiconductor substrates on base substrates having an insulating layer.

Silicon is the basic material for present solid-state electronics, and processing techniques have been evolved for decades. Hence, most electronic integrated circuit devices are based on silicon.

However, III-V compound semiconductors, and especially InGaAs, are being considered as a potential alternative for replacing strained Si in the channel of future nFETs due to their remarkable electron mobility. Moreover, some III-V compound semiconductors present several advantages for opto-electronics applications when compared to Si.

A monolithic integration of compound semiconductors on silicon wafers is desirable and has extensively been investigated in the past. Several problems need to be overcome when compound semiconductors and conventional silicon technologies are to be combined. First, there is a large lattice mismatch between a crystalline silicon substrate and compound semiconductor crystals. Further, there is a thermal expansion coefficient mismatch between the (silicon) wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

Techniques to combine compound semiconductor materials with conventional silicon wafers include bonding techniques. In direct wafer bonding, a compound hetero structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline, for example dielectric, sidewalls. U.S. Pat. No. 8,173,551 B2 discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be large enough to terminate the defects that nucleate at the silicon-compound interface so that higher parts of the crystalline compound show a low crystalline defect density. Some approaches of the ART technique teach the use of Germanium microcrystals grown in silicon oxide trenches on a silicon substrate with a gallium arsenide film on top.

However, in particular for RF and photonic applications, large III-V substrates are desired.

It is therefore desirable to provide improved fabrication methods for semiconductor substrates, in particular for substrates comprising semiconductor compound materials.

SUMMARY

According to a first aspect, the invention is embodied as a method for fabricating a semiconductor substrate. The method comprises steps of providing a crystalline base substrate, forming an insulating layer on the crystalline base substrate and forming a trench in the insulating layer. Thereby a seed surface of the base substrate is exposed. The trench has sidewalls and a bottom. The bottom corresponds to the seed surface of the base substrate. The method comprises further steps of growing, at a first growth step, an elongated seed structure in the trench from the seed surface of the base substrate and forming a cavity structure above the insulating layer. The cavity structure covers the elongated seed structure and extends laterally to the elongated seed structure. The method comprises a further step of growing, at a second growth step, the semiconductor substrate in the cavity structure from the elongated seed structure.

Methods according to embodiments of the first aspect may facilitate an efficient fabrication of semiconductor substrates with low defects and high quality.

According to embodiments, a two-step approach is used encompassing the first growth step and the second growth step. While at the first growth step a linear seed is grown in the trench from the seed surface at the base substrate, at the second growth step the semiconductor substrate is grown from the elongated seed structure in the cavity structure. As the cavity structure extends laterally to the elongated seed structure, the semiconductor substrate is also grown in a lateral direction. The term "laterally" is used in this context, as is customary, to indicate orientation generally parallel to the plane of the base substrate, as opposed to generally vertically, or outwardly, from the base substrate surface. The different growth directions of the first growth step and the second growth step facilitate a defect filtering during the two-step growth process.

According to embodiments, an elongated seed structure is understood as a seed structure that has an elongated shape. More particularly, it is a structure that has a length in a first direction (x-direction) that is greater than the width in a second direction (y-direction), the second direction being orthogonal to the first direction. According to embodiments, the length is at least 10 times greater than the width and according to further embodiments the length is more than 50 times or even more than 100 times greater than the length. In case of seed structures with non-uniform width, the above mentioned dimensions shall refer to the largest width of the seed structure.

According to an embodiment, the first growth step of growing the elongated seed structure is performed before forming the cavity. This facilitates an efficient growth of the elongated seed structure with high quality.

According to an embodiment, the first growth step and the second growth step are embodied as selective epitaxial growth steps. This facilitates a growth of the elongated seed structure and the semiconductor substrate in an efficient and controllable manner.

According to an embodiment, the first growth step of growing the elongated seed structure comprises a nucleation step. The nucleation step is performed at a first temperature. Furthermore, the second growth step of growing the semiconductor substrate is performed at a second temperature. The second temperature is higher than the first temperature.

Investigations have shown that such a two-step approach with different temperature ranges facilitates an overall growth process with high quality and low defects.

The first growth step encompasses a nucleation step at which the elongated seed structure is nucleated on the base substrate. In other words, during the nucleation step of the first growth step, a nucleation layer is formed on the base substrate.

On the one hand, the lower temperature of the nucleation step facilitates the nucleation of the elongated seed structure on the base substrate. In particular, using a lower temperature for the nucleation step may avoid the creation of multiple separated nucleation sites on the seed surface of the base substrate. In particular, it avoids the formation of multiple distributed and separated nucleation sites which are spaced apart from each other and hence have a low granularity. Rather, the low temperature facilitates a nucleation with a high granularity.

On the other hand, using a higher temperature for the second growth step facilitates the growth of high quality substrates in the lateral direction.

According to embodiments, the first temperature of the nucleation step is in a range between 300 degree Celsius and 400 degree Celsius and the second temperature for growing the semiconductor substrate is in a range between 500 degree Celsius and 650 degree Celsius. These temperature ranges facilitate a particularly advantageous overall growth process.

According to embodiments, the first growth step comprises a plurality of sub-steps. The plurality of sub-steps encompass a thermal cleaning step. This step cleans and prepares the surface of the base substrate for the subsequent growth of the elongated seed structure. Then the nucleation step is performed after the thermal cleaning step and accordingly a nucleation layer is formed on the surface of the base substrate.

Then a reflow step is performed after the nucleation step. This reflows or in other words melts the top of the elongated seed structure.

Last, but not least, a regrowth step is performed after the reflow step. During the regrowth step, a selective growth of the elongated seed structure is performed. According to embodiments, the reflow step is performed at a third temperature and the regrowth step at a fourth temperature. Both the third temperature and the fourth temperature are higher than the first temperature. According to embodiments, the third temperature and the fourth temperature may be the same. Preferably the third temperature and the fourth temperature are in a range between 500 degree Celsius and 650 degree Celsius.

The reflow step and the regrow step provide the advantage that the quality of the elongated seed structure can be improved. More particularly, due to the relatively low temperature during the nucleation step, the grown nucleation layer may be rather defective. The reflow and regrow step improve the crystalline quality of the elongated seed structure at least in an upper area of the elongated seed structure. This facilitates the further use of the elongated seed structure for a subsequent growth of the semiconductor substrate.

According to an embodiment, the first growth step of growing the first elongated seed structure and the second growth step of growing the semiconductor substrate is performed by metal organic chemical vapor deposition (MOCVD), atmospheric pressure CVD, low or reduced pressure CVD, ultra-high vacuum CVD, molecular beam epitaxy (MBE), atomic layer deposition (ALD) or by hydride vapor phase epitaxy.

Such methods are well established and allow a precise and reliable control of the growth of the elongated seed structure and the semiconductor substrate.

According to an embodiment, the elongated seed structure has a length of more than 20 μm, preferably of more than 50 μm, and more preferably of more than 100 μm. According to an embodiment, a width of the elongated seed structure is in a range between 0.02 μm and 0.2 μm.

Such long and small elongated seed structures facilitate a subsequent growth of large semiconductor substrates at the second growth step.

According to embodiments, a width of the semiconductor substrate is in a range between 2 μm and 20 μm. According to an embodiment, the semiconductor substrate has a length of more than 20 μm, preferably of more than 50 μm, and more preferably of more than 100 μm.

According to an embodiment, the method further comprises growing the semiconductor substrate with an area of more than 40 μm$^2$.

According to an embodiment, the crystalline base substrate comprises a group IV semiconductor material.

According to an embodiment, the crystalline base substrate is a crystalline silicon wafer.

According to an embodiment, the elongated seed structure comprises a group III-V compound material or a group II-VI compound material.

According to an embodiment, the semiconductor substrate comprises a group III-V compound material or a group II-VI compound material.

According to an embodiment, forming the cavity structure comprises steps of forming a sacrificial structure on the elongated seed structure and on the insulating layer, forming a cavity layer on the sacrificial structure and forming an inlet in the cavity layer. Thereby a surface of the sacrificial structure is exposed. Furthermore, forming the cavity comprises a step of selectively removing the sacrificial structure. Thereby, the elongated seed structure is exposed.

Such a method allows an efficient fabrication of cavity structures.

According to an embodiment of another aspect of the invention, a semiconductor structure comprising a crystalline base substrate, an insulating layer on the crystalline base substrate and a trench in the insulating layer is provided. The trench comprises a seed surface of the base substrate. The trench has sidewalls and a bottom, wherein the bottom corresponds to the seed surface of the base substrate. The semiconductor structure comprises an elongated seed structure grown in the trench from the seed surface of the substrate and a compound semiconductor substrate grown from the elongated seed structure and extending laterally to the elongated seed structure. The crystalline base substrate comprises in particular a group IV semiconductor material and the elongated seed structure and the semiconductor substrate comprises in particular a group III-V compound material or a group II-VI compound material.

According to an embodiment of another aspect of the invention, a semiconductor substrate obtainable by a method according to the first aspect is provided.

A further preferred embodiment relates to an electronic device comprising a semiconductor substrate obtainable by a method according to the first aspect. The electronic device may be in particular a RF-device or a photonic device or component.

If not indicated otherwise, the steps of the different aspects of the invention may be performed in different orders. Furthermore, the steps may also be combined, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

DETAILED DESCRIPTION

FIGS. 1a-10 show successive stages of a method for fabricating a semiconductor substrate, in particular a compound semiconductor substrate.

FIGS. 1a-10 and the other Figures subsequently described below generally show enlarged cross-sectional views or top views of initial, intermediate and final structures formed during the stages of the method. In any or all of the figures the dimensions may not be drawn to scale and may be shown in a simplified and schematic way to illustrate the features and principles of embodiments of the invention.

Figure 1A:
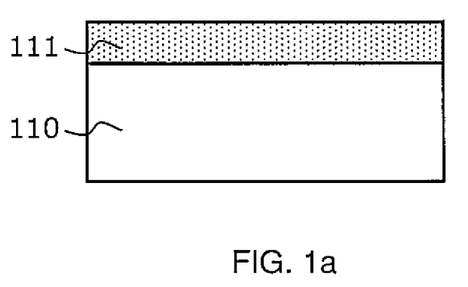
FIG. 1a and FIG. 1b illustrate cross-sectional views of an initial structure.
Figure 1B:
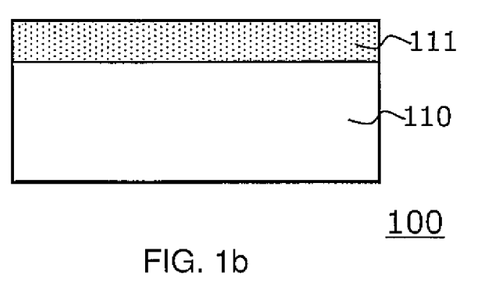

FIG. 1a and FIG. 1b illustrate a cross-sectional view of an initial structure 100. FIG. 1a shows a cross sectional view in a y-z plane and FIG. 1b in an x-z plane orthogonal to the y-z plane. The initial structure 100 comprises a base substrate 110. The base substrate 110 comprises a semiconductor material and may be e.g. a bulk semiconductor substrate, a substrate comprising an insulating layer such as a silicon on insulator (SOI) substrate or a hybrid substrate. The base substrate 110 may be in particular embodied as a crystalline semiconductor wafer of a large diameter. The base substrate may comprise in particular a material from group IV of the periodic table as semiconductor material. Materials of group IV include, for example, silicon, germanium, mixed silicon and germanium, mixed silicon and carbon, mixed silicon germanium and carbon and the like. For example, the base substrate 110 may be a crystalline silicon wafer that is used in the semiconductor industry.

On the base substrate 110 an insulating layer 111 is provided. The insulating layer 111 may be embodied e.g. as a dielectric layer. According to embodiments the insulating layer 111 may be a buried oxide (BOX) layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

The thicknesses of the base substrate 110 and the insulating layer 111 can be any suitable thicknesses.

Figure 2A:
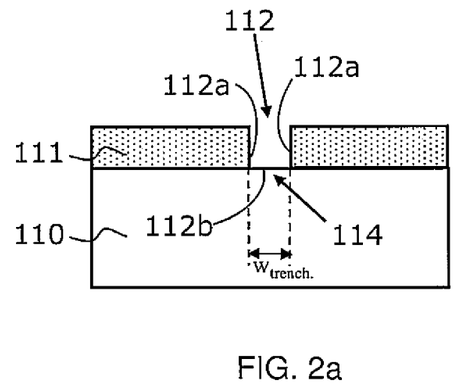
FIG. 2a and FIG. 2b illustrate cross-sectional views of a structure after a trench has been formed in an insulating layer.
Figure 2B:
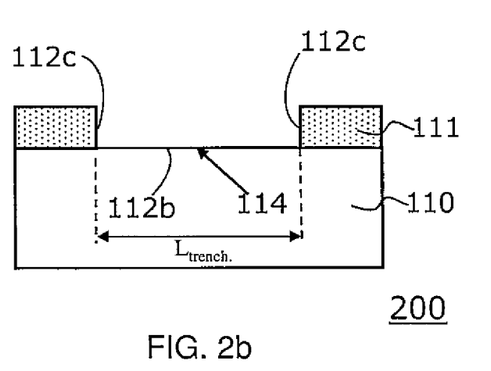

FIG. 2a and FIG. 2b illustrate a cross-sectional view of a structure 200 after a trench 112 has been formed in the insulating layer 111. The trench 112 has sidewalls 112a, a bottom 112b and front walls 112c. The bottom 112b corresponds to a seed surface 114 of the base substrate. The formation of the trench 112 may be performed by lithography and subsequent wet or dry etching techniques. The trench 112 has an elongated shape or in other words a linear shape. The trench has a width w trench in the y-direction and a length $L_{trench}$ in the x-direction. The length $L_{trench}$ is greater than the width $w_{trench}$. According to embodiments the length $L_{trench}$ is significantly greater than the width $w_{trench}$. According to embodiments, the length $L_{trench}$ is at least 5 times, according to further embodiments at least 10 times and according to further embodiments at least 100 times greater than the width $w_{trench}$. According to embodiments, the width $w_{trench}$ is in a range between 0.02 µm and 0.2 µm. According to embodiments, the trench 112 has a length $L_{trench}$ of more than 20 µm, preferably of more than 50 µm, and more preferably of more than 100 µm.

Figure 3A:
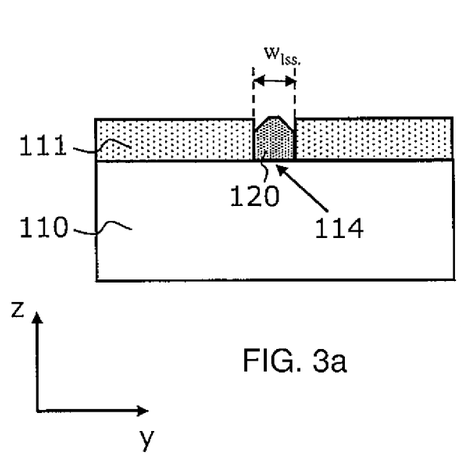
FIG. 3a and FIG. 3b illustrate cross-sectional views after a first growth step has grown an elongated seed structure in the trench.
Figure 3B:
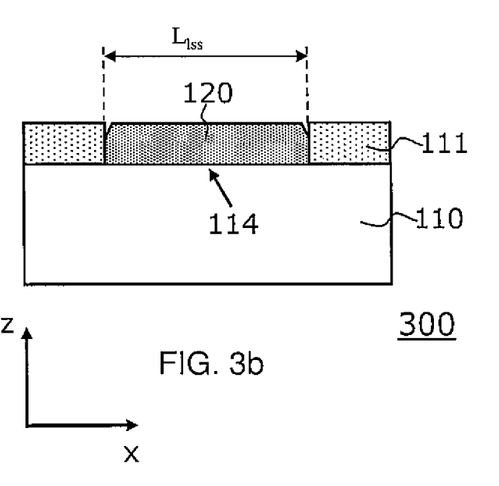

FIG. 3a and FIG. 3b illustrate a cross-sectional view of a structure 300 after a first growth step has been performed. FIG. 3a shows a cross sectional view in a y-z plane and FIG. 3b in an x-z plane orthogonal to the y-z plane. At the first growth step an elongated seed structure 120 has been formed in the trench 112 from the seed surface 114 of the base substrate. According to embodiments, the first growth step may be performed in particular by selective epitaxy in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed.

At a nucleation step, the first growth step for growing the elongated seed structure 120 is performed at a first temperature. The first temperature is preferably in a range between 300 degree Celsius and 400 degree Celsius and the nucleation step of the first growth step may hence be considered as a low temperature growth step.

Corresponding to the dimensions of the trench 112, the elongated seed structure 120 has an elongated shape or in other words a linear shape. The elongated seed structure has a width $w_{lss}$ in the y-direction and a length $L_{lss}$ in the x-direction. The length $L_{lss}$ is greater than the width $w_{lss}$.

According to embodiments the length $L_{lss}$ is significantly greater than the width $w_{lss}$. According to embodiments, the length $L_{lss}$ is at least 5 times, according to further embodiments at least 10 times and according to further embodiments at least 100 times greater than the width $w_{lss}$. According to embodiments, the width $w_{lss}$ is in a range between 0.02 μm and 0.2 μm. According to embodiments, the elongated seed structure 120 has a length $L_{lss}$ of more than 20 μm, preferably of more than 50 μm, and more preferably of more than 100 μm.

Figure 4A:
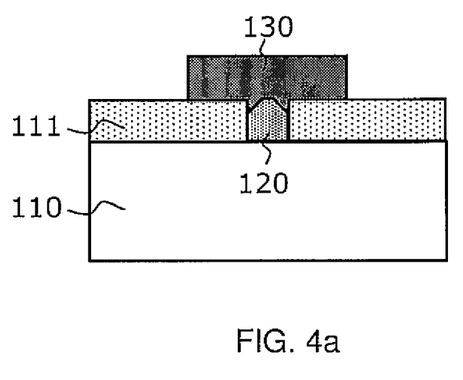
FIG. 4a and FIG. 4b show cross-sectional views after a sacrificial structure has been formed on the insulating layer and the elongated seed structure.
Figure 4B:
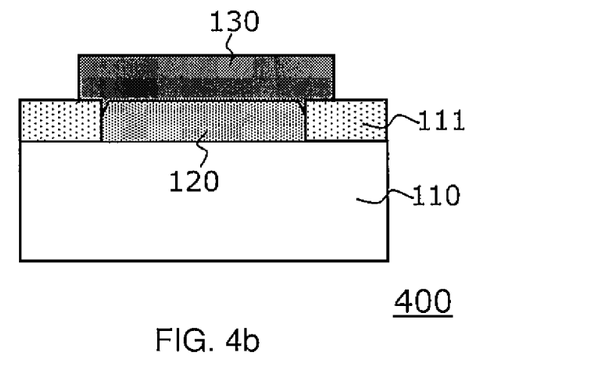

FIG. 4a and FIG. 4b show a cross-sectional view of a structure 400 after a sacrificial structure 130 has been formed on the insulating layer 111 and the elongated seed structure 120. FIG. 4a shows a cross sectional view in a y-z plane and FIG. 4b in a x-z plane orthogonal to the y-z plane. The sacrificial structure 130 comprises a sacrificial material. The sacrificial structure 130 establishes a negative mold for a cavity to be formed subsequently. According to some embodiments the sacrificial structure 130 may comprise amorphous silicon as sacrificial material. According to other embodiments one may also use polymers or other suitable materials that can be removed easily in a subsequent step. According to another preferred embodiment the sacrificial material may comprise $Si_xGe_{1-x}$ where x=0 to 1, poly-Silicon or amorphous Silicon. This allows the use of a plurality of well-known and established fabrication processes and methods to form the sacrificial structure 130. The sacrificial structure 130 may be deposited in a technology that is particularly suitable for the respective sacrificial material and may have any desired form and shape. Fabrication processes such as lithography and etching processes may be adapted and optimised for the respective sacrificial material.

Figure 5A:
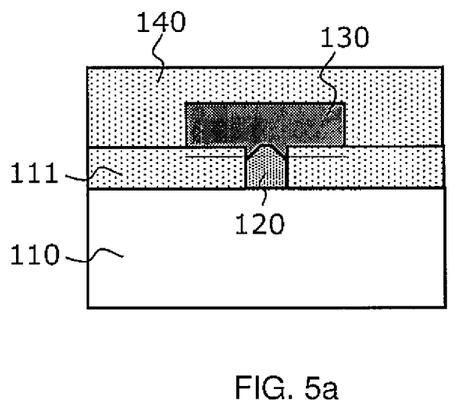
FIG. 5a and FIG. 5b show cross-sectional views of a structure after a cavity layer has been formed on all exposed surfaces of the structure.
Figure 5B:
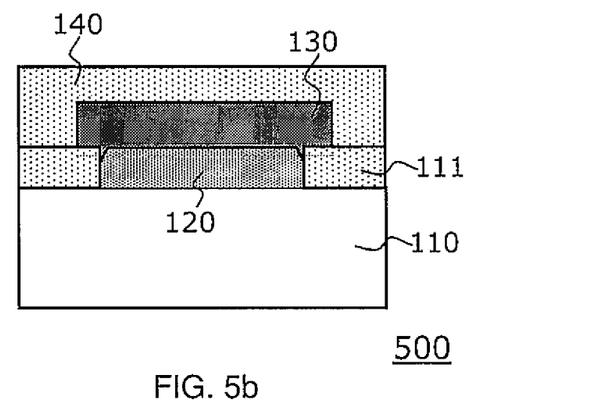

FIG. 5a and FIG. 5b show a cross-sectional view of a structure 500 after a cavity layer 140 has been formed on all exposed surfaces of the structure 400. FIG. 5a shows a cross sectional view in a y-z plane and FIG. 5b in a x-z plane orthogonal to the y-z plane.

More particularly, the cavity layer 140 is formed on the sacrificial structure 130 and on the insulating layer 111. The cavity layer 140 is typically an insulating layer, e.g. of an oxide such as silicon oxide or silicon nitride, but might also be a layer of carbon or of other materials suppressing deposition of the semiconductor during a subsequent selective growth in the cavity structure. According to an embodiment the cavity layer 140 may be formed e.g. as blanket oxide layer using conformal deposition techniques as mentioned above.

According to embodiments, the material of the cavity layer 140 is selected to have a low sticking coefficient, and hence low nucleation probability, for the semiconductor material to be grown in the cavity structure.

Figure 6A:
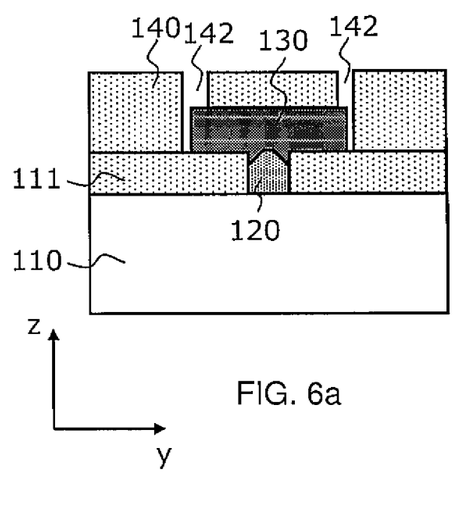
FIG. 6a and FIG. 6b show cross-sectional views after two inlets have been formed in the cavity layer.
Figure 6B:
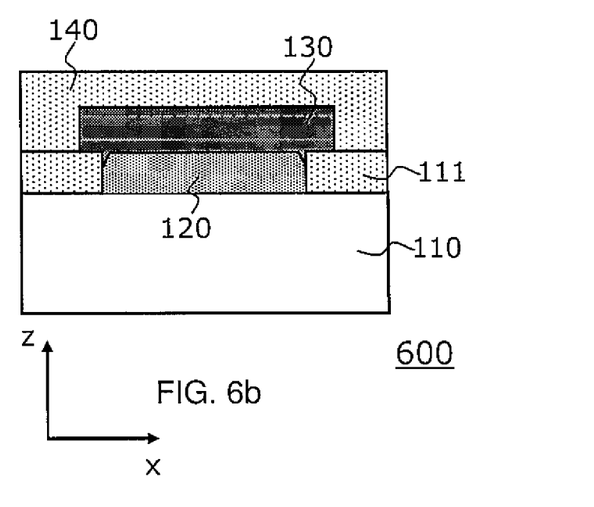

FIG. 6a and FIG. 6b show a cross-sectional view of a structure 600 after two inlets 142 have been formed in the cavity layer 140. FIG. 6a shows a cross sectional view in a y-z plane and FIG. 6b in a x-z plane orthogonal to the y-z plane. The formation of the inlets 142 has exposed some surfaces of the sacrificial structure 130. The formation of the inlets 142 may be performed by lithography and subsequent wet or dry etching techniques.

Figure 7A:
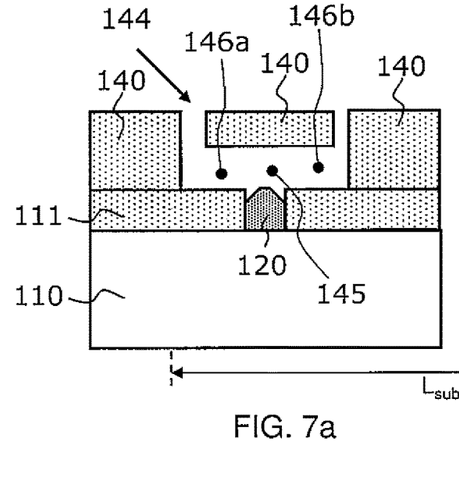
FIG. 7a and FIG. 7b show cross-sectional views of a structure after the sacrificial material of the sacrificial structure has been selectively removed.
Figure 7B:
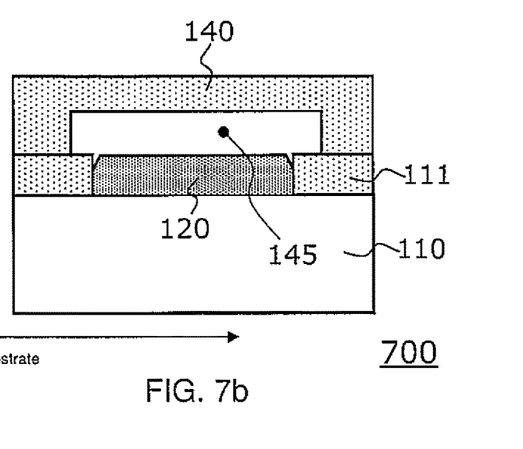

FIG. 7a and FIG. 7b show a cross-sectional view of a structure 700 after the sacrificial material of the sacrificial structure 130 has been selectively removed. FIG. 7a shows a cross sectional view in a y-z plane and FIG. 7b in a x-z plane orthogonal to the y-z plane.

This has formed a cavity structure 144 comprising a cavity 145 above the insulating layer 111 and the elongated seed structure 120. The cavity 145 comprises two lateral growth wings or growth portions 146a and 146b extending laterally in the y-direction over the whole length of the elongated seed structure 120. The selective removal may be performed by selective etching techniques. The suitable etching technique may depend on the material used as sacrificial material. There are, for example, etching techniques available that selectively remove amorphous silicon as sacrificial material. According to a preferred embodiment the sacrificial material may be $Si_xGe_{1-x}$ and the selective etching may be performed by dry etching with e.g. xenon difluoride ($XeF_2$) or wet etching with e.g. TMAH. In general the etching technique is chosen to be such that it only etches the sacrificial material of the sacrificial structure 130, but not the material of the cavity layer 140 and the material of the insulating layer 111.

Figure 8A:
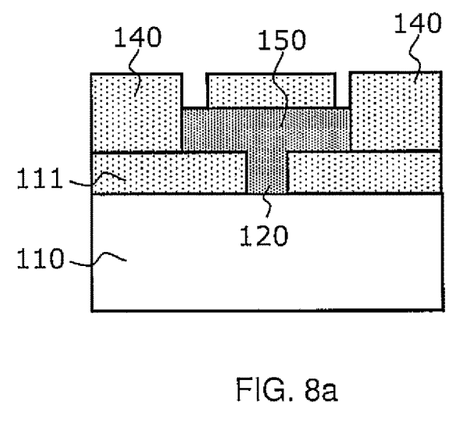
FIG. 8a and FIG. 8b show cross-sectional views of a structure after a semiconductor substrate has been grown at a second growth step.
Figure 8B:
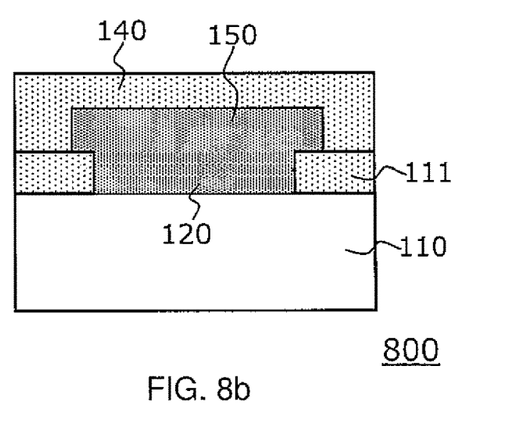

FIG. 8a and FIG. 8b show a cross-sectional view of a structure 800 after a second growth step has been performed. FIG. 8a shows a cross sectional view in a y-z plane and FIG. 8b in a x-z plane orthogonal to the y-z plane. At the second growth step a semiconductor substrate 150 has been grown, starting from the elongated seed structure, on the elongated seed structure 120 in the cavity 145.

The second growth step is performed at a second temperature which is chosen to be higher than the first temperature of the nucleation step of the first growth step. The second temperature is preferably in a range between 500 degree Celsius and 650 degree Celsius, in particular at about 550 degree Celsius. Such a high temperature facilitates the growth of high quality semiconductor substrates in the lateral direction. Due to the lateral extension of the cavity 145, the crystal growth is formed to change its direction, namely from the vertical z-direction to the lateral y-direction.

Due to the combination of the first and the second growth step in different directions a 3-dimensional defect filtering is performed, thereby further improving the quality of the semiconductor substrate.

As illustrated above, the first growth step is performed before the forming of the cavity.

The growth of the semiconductor substrate 150 at the second growth step may be performed in particular by selective epitaxy in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed.

Figure 9A:
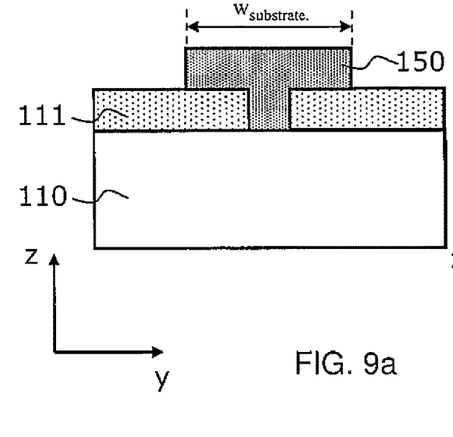
FIG. 9a and FIG. 9b show cross-sectional views of a structure after removal of the cavity layer.
Figure 9B:
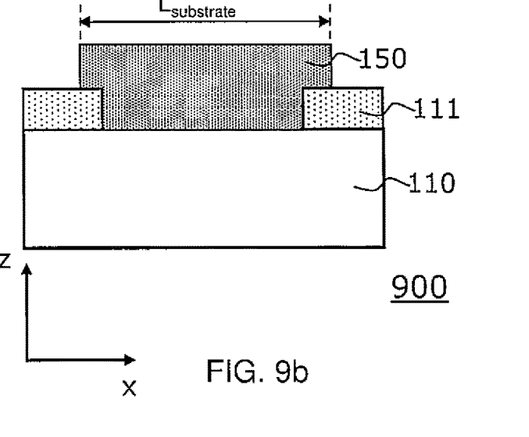

FIG. 9a and FIG. 9b show a cross-sectional view of a structure 900 after removal of the cavity layer 140. FIG. 9a shows a cross sectional view in a y-z plane and FIG. 9b in a x-z plane orthogonal to the y-z plane. This may be done by suitable etching techniques.

Figure 10:
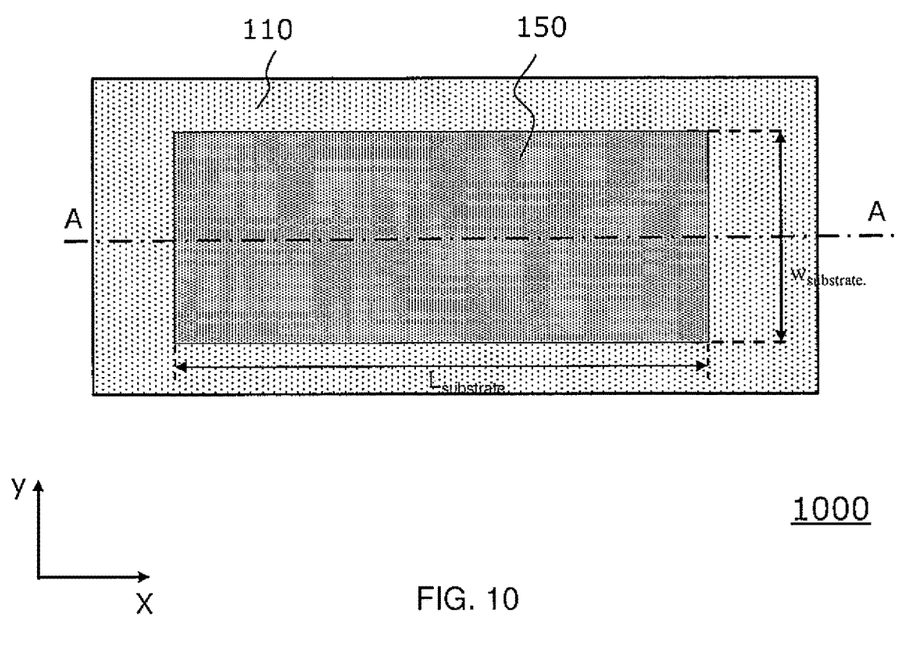
FIG. 10 shows a corresponding top view of the structure of FIG. 9a and FIG. 9b.

FIG. 10 shows a corresponding top view of the structure 900 of FIG. 9a and FIG. 9b. More particularly, the structure 900 of FIG. 9b is an exemplary cross section taken along the line A-A of FIG. 10. However, as mentioned above, it should be noted that the dimensions of FIGS. 9a, 9b and 10 are not to scale. For example, the dimension of the length $L_{substrate}$ shown in FIG. 9b is shorter than the dimension of the length $L_{substrate}$ shown in FIG. 10. The shorter dimension of the length $L_{substrate}$ shown in FIG. 9b and the corresponding previous figures was chosen to allow to show the corresponding views of the x-z and the y-z-plane next to each other.

As can be seen in FIG. 10, the grown semiconductor substrate 150 has a length $L_{substrate}$ and a width $w_{substrate}$.

The length $L_{substrate}$ corresponds essentially to the length $L_{lss}$ of the elongated seed structure 120. The width $w_{substrate}$ of the semiconductor substrate 120 in the growth direction y can be controlled via the time of the epitaxial growth.

Hence according to embodiments the length $L_{substrate}$ is greater than 20 μm. According to further embodiments, the length $L_{substrate}$ is greater than 50 μm and according to further embodiments, the length $L_{substrate}$ is greater than 100 μm.

The width $w_{substrate}$ of the semiconductor substrate 120 is according to embodiments in a range between 2 μm and 20 μm.

According to embodiments the semiconductor substrate 150 has an area of more than 40 μm².

The semiconductor materials of the elongated seed structure 120 and the semiconductor substrate 150 may be generally any material suitable for epitaxial growth. According to preferred embodiments the semiconductor materials of the elongated seed structure 120 and the semiconductor substrate 150 may be a group compound semiconductor material. The group III-V compound semiconductor material could be a binary material such, as for example, Gallium Arsenide (GaAs) or Gallium Antimonide (GaSb). The group III-V material could also be a tertiary material such as, for example, Indium Gallium Arsenide (InGaAs) or Indium Gallium Antimonide (InGaSb). According to other embodiments group II-VI semiconductor compounds, mixed II-VI compounds, and IV-VI compounds may be used. According to another preferred embodiment $In_xGa_{1-x}As$ where x=0 to 1 may be used. According to other embodiments further alloyed combinations of (In, Ga) and (As, Sb, P) may be used. Further examples include gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe) and the like.

Figure 11:
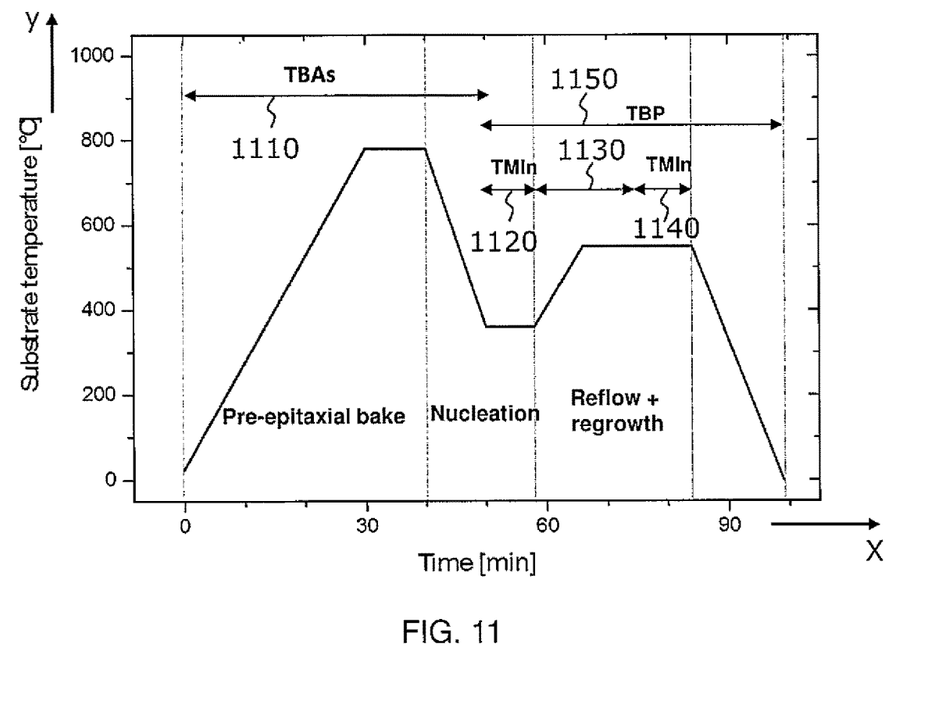
FIG. 11 shows a temperature profile of the base substrate during sub-steps of the first growth step.

FIG. 11 shows a temperature profile of the first growth step in more detail. More particularly, the y-axis denotes the substrate temperature of the base substrate and the x-axis the time.

In the following the first growth step is described for the growth of an elongated seed structure of indium phosphide (TnP).

The first growth step may comprise several sub-steps. At first, a thermal cleaning step is performed, which may also be denoted as a pre-epitaxial bake step. During this thermal cleaning step, the base substrate is heated up to a temperature of about 800° C. To further facilitate the cleaning, the surface of the base substrate may be exposed to Tertiary-butyl-arsine (TBAs) for a time interval 1110.

After this preparatory step, a nucleation step is performed. At the nucleation step, the base substrate is cooled down and the temperature of the base substrate is kept substantially lower, more particularly at a first temperature in a range between 300° C. and 400° C. Investigations have shown that such a low temperature facilitates the formation of a nucleation layer on the base substrate. In particular, it avoids the formation of multiple distributed and separated nucleation sites which are spaced apart from each other and hence have a low granularity. Rather, the low temperature facilitates a nucleation with high granularity.

At the beginning of the nucleation step a nucleation layer epitaxy is started and the nucleation step is performed during a time interval 1120. For the epitaxial growth of the nucleation layer Trimethylindium (TMIn) as well as Tertiary-butyl-phosphine (TBP) are added as precursor materials during the time interval 1120. Thereby, InP is nucleated at the seed surface of the base substrate.

After the nucleation step, the grown nucleation layer is rather defective. To improve the quality of the elongated seed structure and to provide a crystalline elongated seed structure, a reflow step is performed next with a temperature of 500° C. or more, which is also denoted as third temperature. During the reflow step, performed during an interval 1130, no TMIn is added as precursor material, only TBP. Accordingly, no growth of InP takes place during the reflow step. Then, during a subsequent interval 1140, a regrowth step is performed to regrow a bit of the III-V material, i.e. InP in this example, on top of the elongated seed structure. The regrowth step is also performed at a higher temperature of 500° C. or more, which is also denoted as fourth temperature. While TMIn is added as precursor material only during the intervals 1120 and 1140, TPP may be added during a longer interval 1150 which may encompass the intervals 1120, 1130 and 1140. The regrowth with the higher fourth temperature provides a high quality crystalline growth at least in a top part of the elongated seed structure.

As a result, at the first growth step an elongated seed structure of a material has been grown on top of the base substrate. The elongated seed structure may then be used as seed in the second growth step for a lateral overgrowth.

Figure 12:
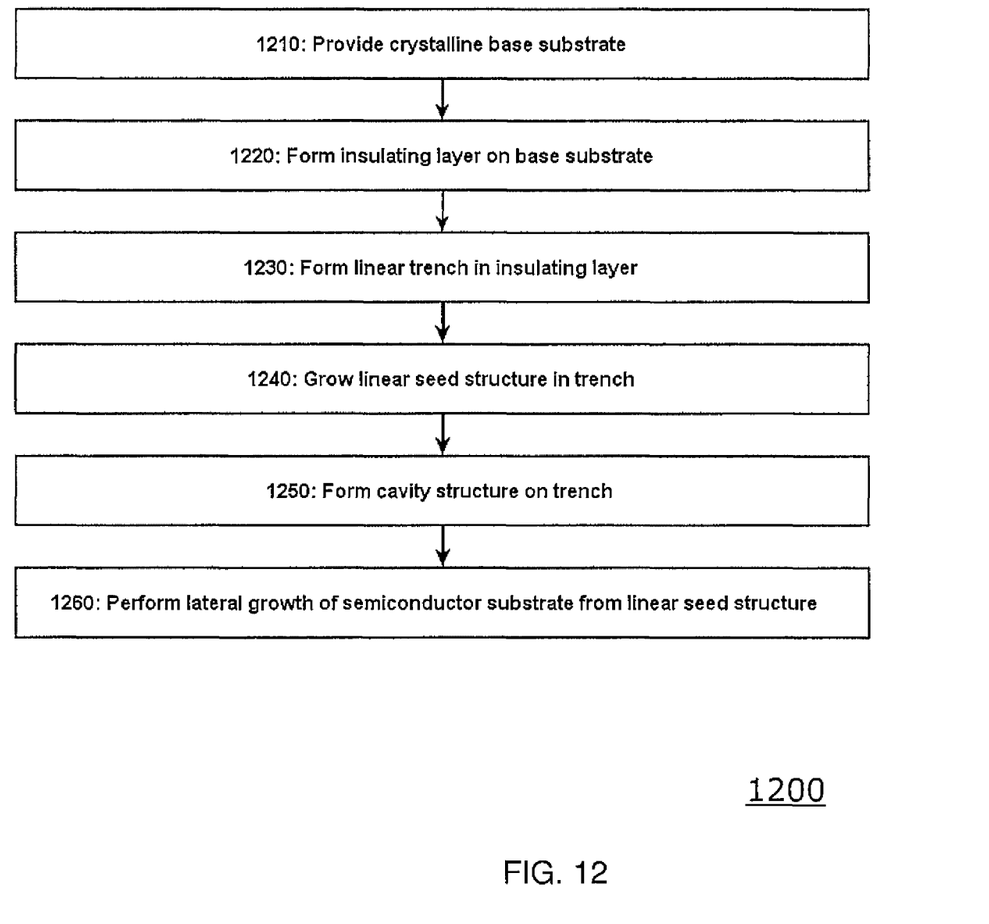
FIG. 12 shows a flow charts of method steps of a method for fabricating a semiconductor substrate according to an embodiment of the invention.

FIG. 12 shows a flow charts of method steps of a method for fabricating a semiconductor substrate according to an embodiment of the invention.

At a step 1210, a crystalline base substrate is provided.

At a step 1220, an insulating layer is formed on the crystalline base substrate.

At a step 1230, a linear trench is formed in the insulating layer. This exposes a seed surface of the base substrate. The trench has sidewalls and a bottom, wherein the bottom corresponds to the seed surface of the base substrate.

At a step 1240, an elongated seed structure is grown in the trench from the seed surface of the substrate. This establishes a first growth step. The first growth step comprises a nucleation step and may comprise further sub-steps, such as a thermal cleaning step, a reflow step and a regrowth step as explained above.

At a step 1250, a cavity structure is formed above the insulating layer. The cavity structure covers the elongated seed structure and extends laterally to the elongated seed structure.

At a step 1260, the semiconductor substrate is grown laterally in the cavity structure from the elongated seed structure. This establishes a second growth step in the lateral direction.

While illustrative examples are given above, it will be appreciated that the basic fabrication steps described above can be used to produce semiconductor structures and substrates of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures may be preferably crystalline seed surfaces, but may according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

Methods according to embodiments of the invention allow to grow in a very controlled way large-scale substrates of semiconductor compounds. The methods can be used for a wide range of materials such as SiGe, Ge, GaAs, AlAs, InAs, GaP, AlP, InP, GaSb, InSb and their ternary/quaternary alloy systems. The direct integration of these compounds on industry-standard (001) Si substrates can be used for a wide range of applications, including RF, nanoelectronics and optoelectronic devices.

By appropriate shaping of the sacrificial structure in fabrication processes embodying the invention, cavity structures and corresponding cavities can be formed with any desired shapes and cross-sectional dimensions. Furthermore, the cross-section may be varied along the length of the cavity structures if desired.

The disclosed semiconductor structures and substrates can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value.

Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a semiconductor substrate, the method comprising:
    providing a crystalline base substrate;
    forming an insulating layer on the crystalline base substrate;
    forming a trench in the insulating layer, thereby exposing a seed surface of the base substrate, the trench having sidewalls and a bottom, wherein the bottom corresponds to the seed surface of the base substrate;
    growing, at a first growth step, an elongated seed structure in the trench from the seed surface of the base substrate;
    forming a cavity structure above the insulating layer, the cavity structure covering the elongated seed structure and extending laterally to the elongated seed structure; and
    growing, at a second growth step, the semiconductor substrate in the cavity structure from the elongated seed structure.

2. A method as claimed in claim 1, wherein the first growth step of growing the elongated seed structure is performed before forming the cavity.

3. A method as claimed in claim 1, wherein
    the first growth step of growing the elongated seed structure comprises a nucleation step, wherein the nucleation step is performed at a first temperature; and
    the second growth step of growing the semiconductor substrate is performed at a second temperature, wherein the second temperature is higher than the first temperature.

4. A method as claimed in claim 3, wherein the first temperature is in a range between 300 degree Celsius and 400 degree Celsius and the second temperature is in a range between 500 degree Celsius and 650 degree Celsius.

5. A method as claimed in claim 1, wherein the first growth step and the second growth step are embodied as selective epitaxial growth steps.

6. A method as claimed in claim 1, wherein the first growth step of growing the first elongated seed structure and the second growth step of growing the semiconductor substrate is performed by one of: metal organic chemical vapor deposition; atmospheric pressure chemical vapor deposition; low or reduced pressure chemical vapor deposition; ultra-high vacuum chemical vapor deposition; molecular beam epitaxy; atomic layer deposition and hydride vapor phase epitaxy.

7. A method as claimed in claim 3, wherein the first growth step comprises a plurality of sub-steps, the plurality of sub-steps encompassing:
    a thermal cleaning step;
    the nucleation step performed after the thermal cleaning step;

a reflow step performed after the nucleation step; and
a regrowth step performed after the reflow step.

8. A method as claimed in claim 7, wherein
the reflow step is performed at a third temperature and the regrowth step at a fourth temperature, wherein the third temperature and the fourth temperature are higher than the first temperature.

9. A method as claimed in claim 8, wherein the third temperature and the fourth temperature are in a range between 500 degree Celsius and 650 degree Celsius.

10. A method as claimed in claim 1, wherein the elongated seed structure has a length of more than 20 µm.

11. A method as claimed in claim 1, wherein a width of the elongated seed structure is in a range between 0.02 µm and 0.2 µm.

12. A method as claimed in claim 1, wherein a width of the semiconductor substrate is in a range between 2 µm and 20 µm.

13. A method as claimed in claim 1, wherein the semiconductor substrate has a length of more than 20 µm.

14. A method as claimed in claim 1, comprising growing the semiconductor substrate with an area of more than 40 µm².

15. A method as claimed in claim 1, wherein the crystalline base substrate comprises a group IV semiconductor material.

16. A method as claimed in claim 12, wherein the crystalline base substrate is a crystalline silicon wafer.

17. A method as claimed in claim 1, wherein the elongated seed structure comprises a group III-V compound material or a group II-VI compound material.

18. A method as claimed in claim 1, wherein the semiconductor substrate comprises a group III-V compound material or a group II-VI compound material.

19. A method as claimed in claim 1, wherein forming the cavity structure comprises:
forming a sacrificial structure on the elongated seed structure and on the insulating layer;
forming a cavity layer on the sacrificial structure;
forming an inlet in the cavity layer, thereby exposing a surface of the sacrificial structure; and
selectively removing the sacrificial structure, thereby exposing the elongated seed structure.

* * * * *